(12) United States Patent
Ghoshal

(10) Patent No.: US 6,282,907 B1
(45) Date of Patent: Sep. 4, 2001

(54) THERMOELECTRIC COOLING APPARATUS AND METHOD FOR MAXIMIZING ENERGY TRANSPORT

(75) Inventor: Uttam Shyamalindu Ghoshal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/458,271

(22) Filed: Dec. 9, 1999

(51) Int. Cl.[7] .................................... F25B 21/02
(52) U.S. Cl. ................................ 62/3.7; 62/3.2
(58) Field of Search ............... 62/3.7, 3.3, 159, 62/3.2; 136/203, 204

(56) References Cited

U.S. PATENT DOCUMENTS

| | | | |
|---|---|---|---|
| 3,663,307 | * 5/1972 | Mole | 136/204 |
| 5,279,128 | * 1/1994 | Tomatsu et al. | 62/3.4 |
| 5,867,990 | * 2/1999 | Ghoshal | 62/3.7 |
| 5,966,939 | * 10/1999 | Tauchi | 62/3.7 X |
| 5,966,941 | 10/1999 | Ghoshal | 62/3.7 |
| 6,000,225 | 12/1999 | Ghoshal | 62/3.7 |
| 6,096,965 | * 8/2000 | Ghamaty et al. | 136/203 X |

FOREIGN PATENT DOCUMENTS

| | | |
|---|---|---|
| 363253677 | * 10/1988 | (JP) . |
| 403263382 | * 11/1991 | (JP) . |
| PCT/GB98/03412 | 12/1999 | (WO) . |
| WO 00-08693 | 2/2000 | (WO) .............................. H01L/35/34 |

OTHER PUBLICATIONS

Rinzler, A.G. et al.; Large–Scale Purification of Single–Wall Carbon Nanotubes: Process, Product and Characterization; 1998; pp. 29–37.

Liu, Jie et al.; Fullerene Pipes; Science; vol. 280; May 22 1998; pp. 1253–1255.

Thess, Andreas et al.; Crystalline Ropes of Metallic Carbon Nanotubes; Science; vol. 273; Jul. 26, 1996; pp. 483–487.

Tubes @ Rice; Rice University; http://cnst.rice.edu/tubes/;.

An Introduction to Thermoelectrics; http://www.tellurex.com/resource/introc.html.

Tellurex Corporation Frequently Asked Questions; http://www.tellurex.com/resource/txfaqc.html.

* cited by examiner

*Primary Examiner*—William Doerrler
*Assistant Examiner*—Chen-Wen Jiang
(74) *Attorney, Agent, or Firm*—Duke W. Yee; Casimer K. Salys (57) ABSTRACT

Apparatus and method for sub-ambient cooling using thermoelectric dynamics in conjunction with novel configuration schemes to maximize energy transport to thereby increase the efficiency of thermoelectric cooling. In one form, a junction maximizes energy transport being positioned between and coupled to thermoelectric elements having minimal spacing to provide efficient thermoelectric cooling. Preferable implementations provide thermoelectric elements configured such that thermal energy is transferred away from the junction and dissipated by thermal sinks coupled to thermoelectric elements

40 Claims, 4 Drawing Sheets

NO COMPRESSOR
NO EVAP. COILS
NO COND. COILS
NO CFC

THERMOELECTRIC COOLING APPARATUS AND METHOD FOR MAXIMIZING ENERGY TRANSPORT

CROSS REFERENCE TO RELATED APPLICATION

The present application is related to U.S. patent application Ser. No. 09/458,270 filed even date herewith by common assignee and having the title "Electrically-Isolated Ultra-Thin Substrates For Thermoelectric Coolers" and being incorporated herein by reference.

FIELD OF THE INVENTION

The present invention generally relates to thermoelectric cooling. More particularly, the invention is directed to apparatuses and methods for attaining high relative efficiency thermoelectric cooling by maximizing energy transport through novel thermoelectric element configurations.

BACKGROUND OF THE INVENTION

Sub-ambient cooling is conventionally accomplished through gas/liquid vapor phase compression based refrigeration cycles using Freon type refrigerants to implement the heat transfers. Such refrigeration systems are used extensively for cooling human residences, foods, and vehicles. Sub-ambient cooling is also often used with major electronic systems such as mainframe server and workstation computers. Though vapor compression cooling can be very efficient, it does require significant moving hardware, including at a minimum, a compressor, a condenser, an evaporator, and related coolant transfer plumbing. As a result of the complexity, associated high cost, and lower reliability, vapor compression cooling has not found material acceptance in small cooling applications, for example personal computers.

The fact that CMOS logic can operate materially faster as the temperature decreases has been well known for at least ten years. For example, if CMOS logic devices are operated at −50° C., the performance is improved by 50 percent over room ambient temperature operation. Liquid nitrogen operating temperatures, in the range of −196° C., have shown 200 percent performance improvements. Similar benefits have shown to accrue for integrated circuit wiring, where metal wiring resistances decrease by a factor of 2 for integrated circuits operated at −50° C. in comparison to room ambient operation. This improvement rivals the recent technological breakthrough of using copper wiring in integrated circuits to reduce interconnect resistance and thereby effectively increase the operating frequencies attainable. Thus, sub-ambient operation of integrated circuit logic devices, such as field effect transistors, as well as the interconnect wiring can materially improve the integrated circuit performance, leaving the question of how to accomplish such cooling in the confines of an ever decreasing size and materially shrinking cost environment.

Thermoelectric cooling is one alternative that has found some usage given the compact size of the prevalently used Peltier devices. A Peltier device is fabricated from semiconductor material such as bismuth telluride or lead telluride. Though new materials are now being evaluated in various universities, they have yet to reach fruition. The commonly used Peltier materials exhibit very high electrical conductivity and relatively low thermal conductivity, in contrast to normal metals which have both high electrical and thermal conductivity. In operation the Peltier devices transport electrons from a cold sink, at temperature $T_{cold}$, to a hot sink, at temperature $T_{hot}$, in response to an electric field formed across the Peltier device.

Figure 1:
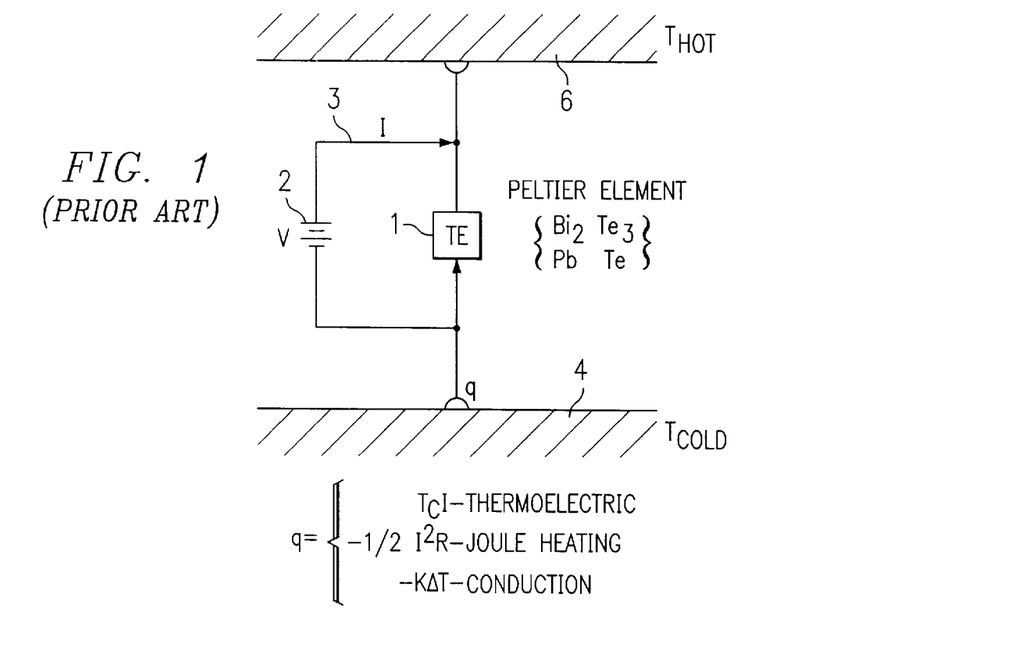
FIG. 1 schematically depicts a conventional statically operable Peltier device cooling system.

FIG. 1 schematically depicts a conventional Peltier type thermoelectric element (TE) 1 with DC power supply 2 creating the electric field across TE 1 while at a load current 3. The desired heat transfer is from cold sink 4, at temperature $T_{cold}$, to hot sink 6, at temperature $T_{hot}$. As indicated in the equation of FIG. 1, the net heat energy transported is composed of three elements, the first representing the Peltier effect (thermoelectric) contribution, the second defining negative Joule heating effects, and the third defining negative conductivity effects. The thermoelectric component is composed of the Seebeck coefficient, the temperature of operation ($T_{cold}$) and the current being applied. The Joule heating component reflects that roughly half the Joule heating goes to the cold sink and remainder to the hot sink. Lastly, the negative component attributable to thermal conduction represents the heat flow through the Peltier device, as defined by the thermal conductivity of the Peltier device, from the hot sink to the cold sink. See equation (1).

$$q = \alpha T_{cold} I - 1/2 I^2 R - K\Delta T \tag{1}$$

Figure 2:
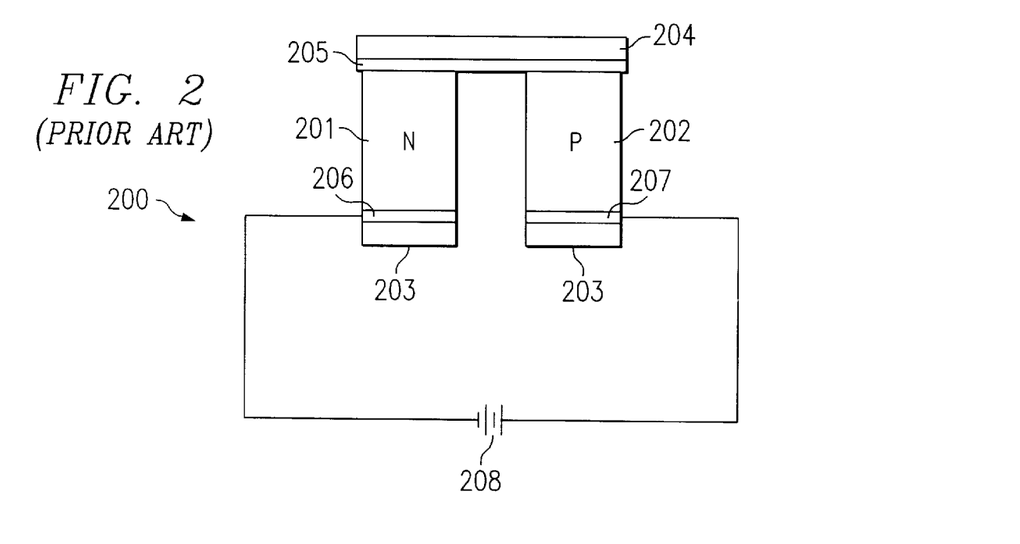
FIG. 2 schematically depicts a conventional thermoelectric cooling apparatus.

FIG. 2 schematically depicts a conventional thermoelectric cooler (TEC) 200 with DC power supply 208 creating an electrical field across thermoelectric element 201, 202 having n-type and p-type semiconductor materials, respectively, to produce a Peltier effect. During operation, thermal sink 203 absorbs thermal energy while thermal sink 204 dissipates thermal energy for providing thermoelectric cooling to an object. Currently, metal tabs 205, 206, 207 are soldered to the thermoelectric elements providing both thermal and electrical conductivity. In this configuration, a problem occurs in that the distance between thermoelectric elements is not minimized thereby leading to inefficient energy transport. Another common problem that occurs is that the metal tabs and solder reduces energy transport between the thermoelectric elements creating inefficient thermoelectric cooling.

Thus, there are a number of very fundamental constraints on current thermoelectric coolers that have created a need for maximizing transport between thermoelectric elements to thereby increase thermoelectric cooling.

SUMMARY OF THE INVENTION

The present invention overcomes the fundamental efficiency constraints of thermoelectric element cooling through the application of a junction coupled to and positioned between two thermoelectric elements to maximize energy transport of the thermoelectric elements while minimizing the distance between the thermoelectric elements, thereby providing efficient thermoelectric cooling.

In one form, the invention relates to a thermoelectric cooling apparatus comprising a first thermoelectric element, a second thermoelectric element, and a junction positioned between and coupled to the first and second thermoelectric elements.

In another form, the invention relates to a thermoelectric cooling apparatus comprising a first thermoelectric element, a second thermoelectric element, a third thermoelectric element coupled to the second thermoelectric element, and a junction positioned between and coupled to the first and second thermoelectric elements.

In a still further form, the invention relates to a method of operating a thermoelectric cooling apparatus having a first thermoelectric element, a second thermoelectric element, and a junction positioned between and coupled to the first and second thermoelectric elements, comprising the steps of enabling a voltage across the first thermoelectric element, the second thermoelectric element, and the junction, and transporting energy between the junction and the first and second thermoelectric elements in response to the voltage.

In a still further form, the invention relates to a method of operating a thermoelectric cooling apparatus having a first thermoelectric element, a second thermoelectric element, a third thermoelectric element coupled to the second thermoelectric element, and a junction positioned between and coupled to the first and second thermoelectric elements, comprising the steps of enabling a voltage across the first thermoelectric element, the second thermoelectric element, the third thermoelectric element, and the junction, transporting energy between the junction and the first thermoelectric element, the second thermoelectric element and third thermoelectric element in response to the voltage.

In a particularized form of the invention, a thermoelectric cooling apparatus is provided with a first thermoelectric element having a first type of semiconductor material, a second thermoelectric element having a second type of semiconductor material, and a third thermoelectric element having the first type of semiconductor material. A junction having a thermal sink is positioned between and coupled to the first and second thermoelectric elements such that the distance between the thermoelectric elements is minimized and to maximize energy transport between the junction and the first, second, and third thermoelectric elements, thereby providing efficient thermoelectric cooling.

These and other features of the invention will be more clearly understood and appreciated upon considering the detailed embodiments described hereinafter.

BRIEF DESCRIPTION OF THE DRAWINGS

Other objects, advantages, features and characteristics of the present invention, as well as methods, operation and functions of related elements of structure, and the combination of parts and economies of manufacture, will become apparent upon consideration of the following description and claims with reference to the accompanying drawings, all of which form a part of this specification, wherein like reference numerals designate corresponding parts in the various figures, and wherein:

DETAILED DESCRIPTION OF A PREFERRED EMBODIMENT OF THE INVENTION

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the appended claims.

The conceptual groundwork for the present invention involves increasing the efficiency of thermoelectric cooling apparatuses by maximizing the energy transport or conduction between thermoelectric elements used within the thermoelectric cooling apparatuses. The objective is to increase thermoelectric cooling efficiencies through providing a junction positioned between and coupled to a first and second thermoelectric element so that the distance between the thermoelectric elements is minimized to thereby maximize the entropy gradient and energy transport between the junction and the thermoelectric elements. In mapping temperature as a function of distance from a junction positioned between and coupled to a first and second thermoelectric element, maximum cooling occurs at the junction. Cooling, at the junction, is proportional to JT $d\alpha/dx$ where J is the local current density, T the local temperature, $\alpha$ is the Seebeck coefficient and $d\alpha/dx$ is the entropy gradient. By minimizing the distance between the thermoelectric elements the entropy gradients can be maximized to maximize cooling at the junction while minimizing thermal conductivity across the junction in the direction of electron transport or current flow. Utilizing the proper materials, thermal conductivity along the junction can be maximized. In a preferred implementation, the junction is formed of materials such as carbon nanotubes and diamond, having directional thermal transport properties and which can be used to minimize the distance between the thermoelectric elements while maximizing energy transport and thermal conductivity along the junction.

Figure 3:
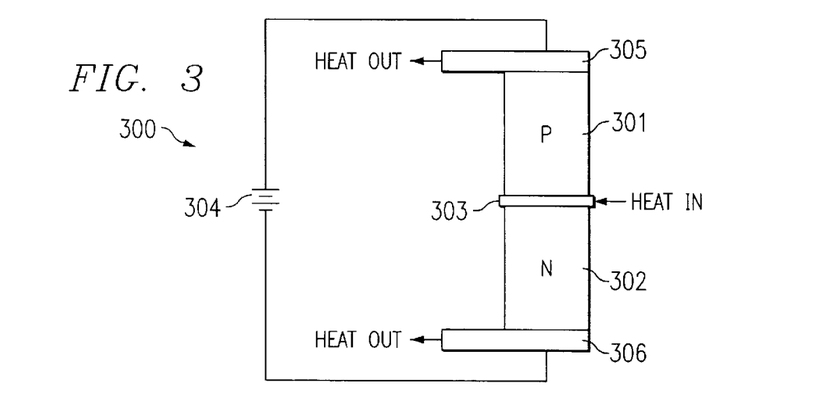
FIG. 3 is a simplified block diagram of a thermoelectric cooling apparatus according to a preferred embodiment of the present invention.

Referring to FIG. 3, a simplified block diagram of a thermoelectric cooling apparatus according to a preferred embodiment of the present invention is shown. Thermoelectric cooling apparatus 300 includes first thermoelectric element 301 made of a p-type semiconductor material and second thermoelectric element 302 made of an n-type semiconductor material. Junction 303 is positioned between and coupled to first and second thermoelectric elements 301 and 302 such that energy transport or conduction between first and second thermoelectric elements 301 and 302 are maximized resulting in efficient thermoelectric cooling. Voltage source 304 is coupled to first and second thermoelectric elements 301 and 302 through electrically and thermally conductive hot sinks 305 and 306 so that a voltage is enabled across first thermoelectric element 301, junction 303 and second thermoelectric element 302, such that a Peltier effect is created and energy is transported between junction 303 and first and second thermoelectric elements 301 and 302 to transfer heat from junction 303 to hot sinks 305 and 306.

In the preferred embodiment of the present invention, junction 303 is positioned between and coupled to first thermoelectric element 301 and second thermoelectric element 302 to ensure that energy transport between thermoelectric elements 301 and 302 is maximized while minimizing the distance between thermoelectric elements 301 and 302.

Junction 303 can be configured utilizing many different types of materials having relative high energy transport and capable of maximizing energy transport between first and second thermoelectric elements 301 and 302 while minimizing the distance between thermoelectric elements 301 and 302. In one embodiment of the present invention, junction 303 is formed from carbon nanotubes for maximizing the energy transport between thermoelectric elements 301 and 302 while minimizing the distance between first and second thermoelectric elements 301 and 302. Carbon nanotubes are single-wall fullerene nanotubes made by a process that includes laser vaporizing a carbon/Ni/Co mixture at 1200° C. The single-wall nanotubes are nearly uniform having an average diameter of 1.2 nm and organize into "ropes" that can be configured into carbon nanotube bundles. The "ropes" are metallic and have a lattice constant of 17 Å with a resistivity of approximately 0.0005 Ω-cm. Carbon nanotubes have high directional thermal conductivity, i.e. the thermal conductivity along the tube approaches that of diamond but conductivity in the normal direction or across the tube is very poor. Furthermore, electrons can tunnel across the nanotubes without dissapating significant energy. Carbon nanotubes and carbon nanotube bundles are described in "Large-scale purification of single-wall carbon nanotubes: process, product, and characterization" by R. E. Smalley et al. herein incorporated by reference.

In one form, carbon nanotubes are contained in toluene solution and deposited on first thermoelectric element 301. The toluene solution is evaporated so that the remaining carbon nanotubes forms junction 303. The carbon nanotubes are positioned having random directions so as to achieve high thermal conductivity in plane and are coupled to first and second thermoelectric elements 301 and 302 by van der Waals forces between the carbon nanotubes and elements 301 and 302. For positioning of carbon nanotubes and their bonding with surfaces see "Manipulation of individual carbon nanotubes and their interaction with surfaces" by T. Hertel, R. Martel, and Ph. Avouris. Journal of Physical Chemistry B 102, p. 910 (1998). Junction 303 being made of carbon nanotubes promotes direct transport and efficient recombination of electrons and holes between first and second thermoelectric elements 301 and 302, thus providing efficient thermoelectric cooling.

In an alternated embodiment, junction 303 can be created by sputtering, such as magnetron sputtering, a thin seed layer of metal, such as copper, on and positioned between and coupled to thermoelectric elements 301 and 302. Additional copper can be deposited onto the thin seed layer of copper using any current process of depositing metals onto substrates, such as electrochemical deposition. Junction 303 is not limited to any one particular type of material and can be configured utilizing many different types of materials capable of maximizing energy transport between junction 303 and first and second thermoelectric elements 301 and 302 while minimizing the distance between first and second thermoelectric elements 301 and 302 thereby providing efficient thermoelectric cooling.

Figure 4A:
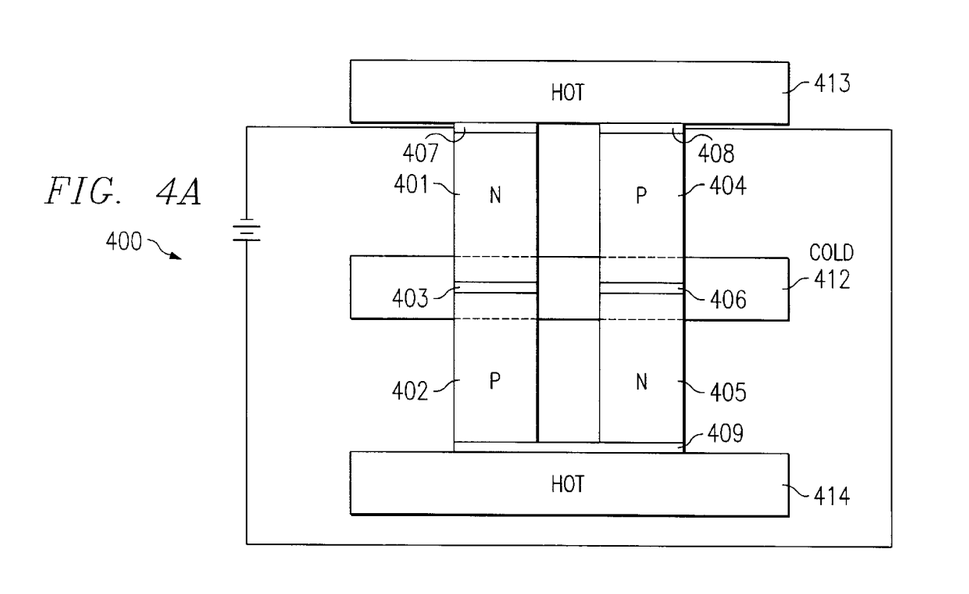
FIGS. 4A and 4B schematically illustrate a laterally configured thermoelectric cooling apparatus according to a preferred embodiment of the present invention.

Referring now to FIG. 4A, a schematic illustration of a laterally configured thermoelectric cooling apparatus according to a preferred embodiment of the present invention is shown. In this embodiment, mixed n and p-type thermoelectric elements are formed in a single layer. Thermoelectric cooling apparatus 400 illustrates one example of configuring thermoelectric cooling apparatuses having thermoelectric elements with junctions positioned between and coupled to the thermoelectric elements for maximizing energy transport between the junction and thermoelectric elements while minimizing the distance between thermoelectric elements for providing efficient thermoelectric cooling.

Thermoelectric cooling apparatus 400 is a laterally configured thermoelectric cooling apparatus having thermoelectric element 401 made of n-type semiconductor material, thermoelectric element 402 made of p-type semiconductor material and junction 403 positioned between and coupled to thermoelectric elements 401 and 402. Junction 403 can be made of any type of material capable of maximizing energy transport between thermoelectric elements 401 and 402. Thermoelectric cooling apparatus 400 includes thermoelectric elements 404 made of p-type semiconductor material and 405 made of n-type semiconductor material having junction 406 positioned between and coupled to thermoelectric elements 404 and 405. Copper tabs 407 and 408 allow series electrical connections similar to conventional TE coolers. Additionally, copper trace 409 is electrically coupled between thermoelectric elements 402 and 405 and thermally coupled to thermal sink 414 to dissipate thermal energy. In the preferred embodiment, thermal sinks 413 and 414 are configured to dissipate thermal energy while thermal sink 412 is configured to absorb thermal energy.

Thermoelectric cooling apparatus 400 further includes power source 414 coupled to copper tabs 407 and 408 for providing a potential across laterally configured thermoelectric cooler 400 to create a Peltier effect. During operation, current is supplied to thermoelectric element 401. As current passes through junction 403 to thermoelectric element 402, maximum energy transport between junction 403 and thermoelectric elements 401 and 402 occurs providing efficient thermoelectric cooling by absorbing thermal energy utilizing thermal sink 412. Current is then transferred to thermoelectric element 405 through copper trace 409 where thermal energy is dissipated by thermal sink 414. Current is then transferred from thermoelectric element 405 through junction 406 to thermoelectric element 404 wherein thermal energy is absorbed by thermal sink 412 and dissipated by thermal sink 413. In this manner, laterally configured thermoelectric cooling apparatus 400 provides efficient thermoelectric cooling through providing a junction between the thermoelectric elements maximizing energy transport while minimizing the distance between the thermoelectric elements.

Figure 4B:
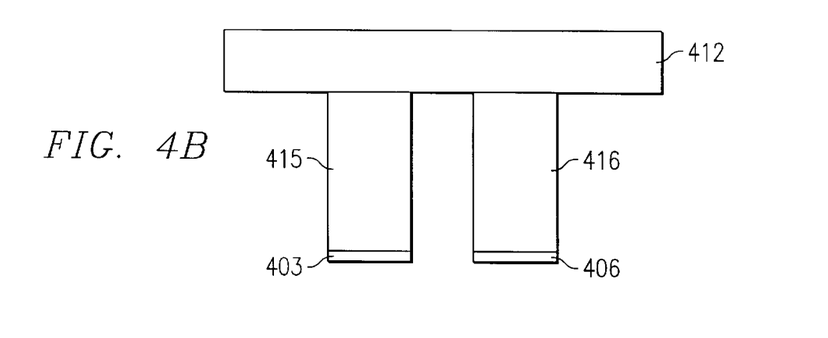

Referring now to FIG. 4B, one method of thermally coupling junctions 403 and 406 to thermal sink 412 while electrically isolating junctions 403 and 406 is shown. FIG. 4B is a cross sectional top view taken at junctions 403 and 406. Junctions 403 and 406 are coupled to thermal sink 412 using thermally conductive but electrically insulating paths 415 and 416, respectively. In a preferred embodiment paths 415 and 416 are made of anodized Aluminum or Beryllium Oxide. It will be appreciated that as the number of junctions increase more elaborate and complex path designs will be needed to avoid contact of paths with other junctions and between junctions to maintain electrical isolation of the junctions. In an alternate embodiment (not shown), thermal sink 412 is made of anodized Aluminum or Beryllium Oxide and coupled directly to junctions 403 and 406. In another alternate embodiment (not shown), thermal sink 412 is made of Aluminum having a thin layer of alumina positioned between the thermal sink and each junction.

Figure 5:
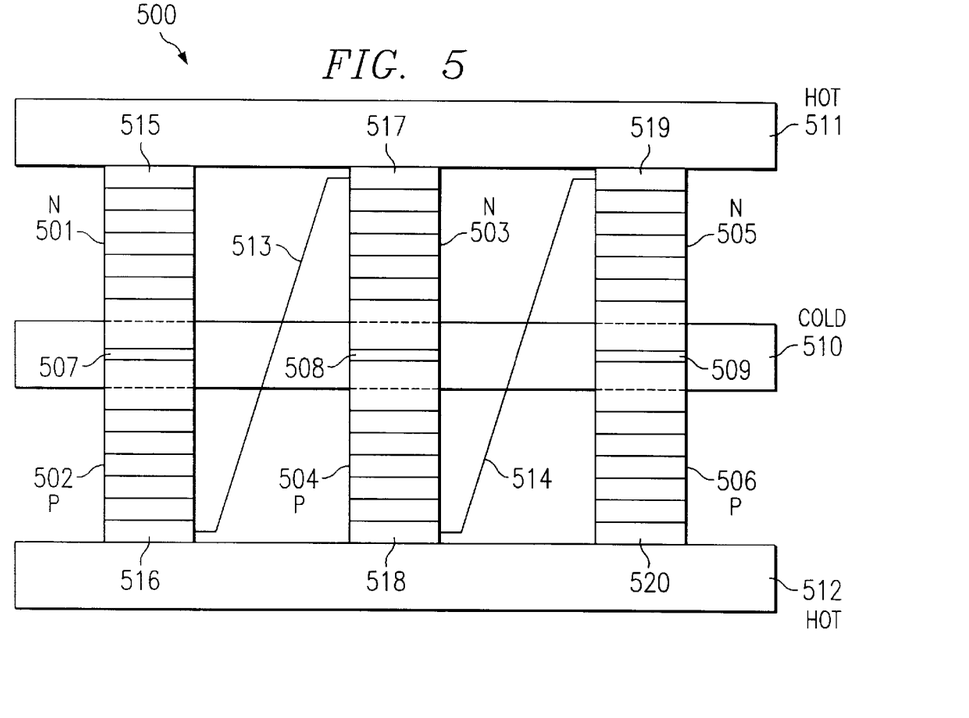
FIG. 5 schematically depicts another laterally configured thermoelectric cooling apparatus according to another embodiment of the present invention.

Referring now to FIG. 5, an illustration of another laterally configured thermoelectric cooling apparatus according to one embodiment of the present invention is shown. In this embodiment, rather than having mixed n and p-type thermoelectric elements on a single layer as described in FIG. 4, n-type thermoelectric elements are formed in a first layer and p-type thermoelectric elements are formed in a second layer. Thermoelectric cooling apparatus 500 includes thermoelectric elements 501, 503, 505 made of n-type semiconductor material and thermoelectric elements 502, 504, 506 made of p-type semiconductor material. Junctions 507, 508, 509 are positioned between and coupled to thermoelectric elements 501, 503, 505 and thermoelectric elements 502, 504, 506, respectively, for maximizing energy transport between the junctions and the thermoelectric elements while minimizing the distance between the thermoelectric elements. For example, junction 507 is positioned between and coupled to thermoelectric element 501 and thermoelectric element 502 so that the distance between junction 507 and thermoelectric elements 501 and 502 is minimized to thereby maximize energy transport between junction 507 and thermoelectric elements 501 and 502. Junctions 507, 508, and 509 can be of any type of material such as a thin layer of metal or carbon nanotubes as described in FIG. 3.

In one embodiment, junctions 507, 508 and 509 are coupled in a manner such as described in connection with FIG. 4, to thermal sink 510 for providing a temperature differential to an object (not shown). Thermoelectric cooling apparatus 500 further includes copper tabs 515, 517, and 519 coupled to thermoelectric elements 501, 503, and 505 for creating a thermal couple to thermal sink 511 such as in a manner similar to that described in connection with FIG. 4. Additionally, copper tabs 516, 518, and 520 are coupled to thermoelectric elements 502, 504, 506 for creating a thermal couple to thermal sink 512 such as in a manner similar to that described in connection with FIG. 4. In one embodiment, thermal sink 510 is configured to be a cold sink for cooling an object by absorbing thermal energy while thermal sinks 511 and 512 are configured to be hot sinks for dissipating thermal energy. Thermal sinks 510, 511, and 512 can be made of any type of material however, in one embodiment thermal sinks 510, 511, and 512 are made of anodized Aluminum or beryllium oxide material.

Thermoelectric cooling apparatus 500 further includes a first conductive element 513 coupled to copper tab 516 and copper tab 517 forming an electrical and thermal junction between thermoelectric element 502 and thermoelectric element 503. Additionally, second conductive element 514 is coupled to copper tab 516 and copper tab 519 forming an electrical and thermal junction between thermoelectric element 504 and thermoelectric element 505. First and second conductive elements can be made of any type of conductive material capable of being coupled to thermoelectric elements. However, in a preferred embodiment first and second conductive elements 513 and 514 are made of 'flex-tape' copper polyimide flexible circuitry provided by Packard-Hughes as described at http://www.packardhughes.com.

During one mode of operating thermoelectric cooling apparatus 500, current flows through thermoelectric element 501, junction 507, and thermoelectric element 502, absorbing thermal energy generated by an object in close proximity to thermal sink 510. Thermal energy is absorbed by a Peltier effect created by the configuration of thermoelectric element 501, junction 507, and thermoelectric element 502 thereby providing efficient cooling as a result of maximizing energy transport between the thermoelectric elements 501 and 502 and junction 507. As current flows through thermoelectric element 502 and conductive element 513 to thermoelectric element 503, thermal energy is released by a Peltier effect through thermal sinks 511 and 512. Current continues to flow through thermoelectric element 503 through junction 508 where the process of thermoelectric cooling is repeated. In this manner, efficient thermoelectric cooling is provided through the junctions being positioned between and coupled to the thermoelectric elements. Energy transport between the junctions and the thermoelectric elements is maximized while thermal energy is transferred away from an object and dissipated by the thermal sinks thereby providing efficient thermoelectric cooling.

Figure 6:
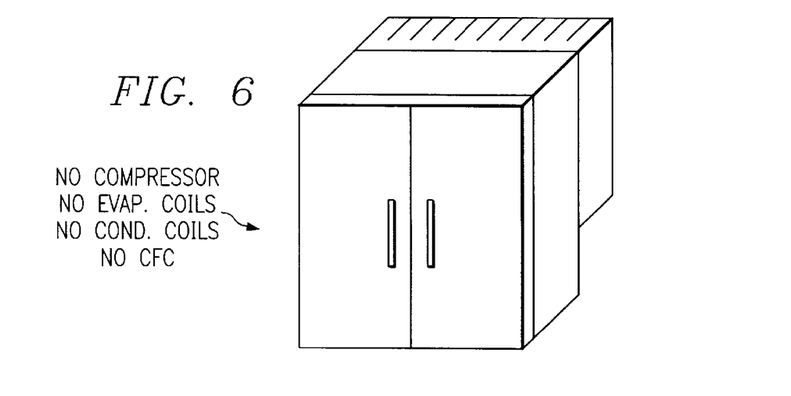
FIG. 6 schematically depicts the extended use of the invention to a food refrigeration system.

FIG. 6 schematically illustrates the use of the present invention in an extended array form to efficiently and cleanly operate a food refrigerator. The high efficiency of an apparatus utilizing mechanical and thermoelectric cooling system is characterizing the present invention facilitates the migration of mixed cooling from highly selective and limited applications, such as mainframe computer system cooling, to major appliances in substantially every home.

Figure 7:
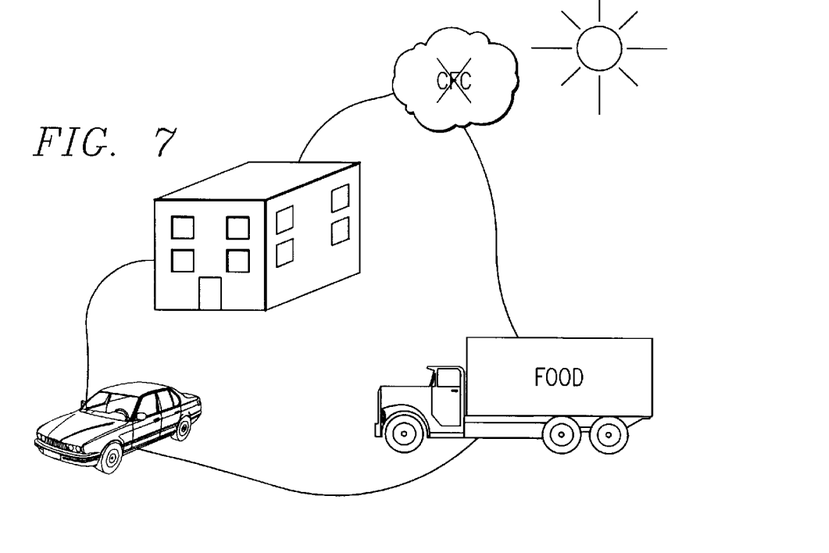
FIG. 7 schematically depicts potential applications and benefits of the invention as applied to various human residences and transportation media.

Still further applications are schematically depicted in FIG. 7, as the concepts underlying the present invention are further refined and extended in size to encompass major heat transfer applications encompassing residential and office cooling, food transportation systems, and personal vehicle cooling.

Figure 8:
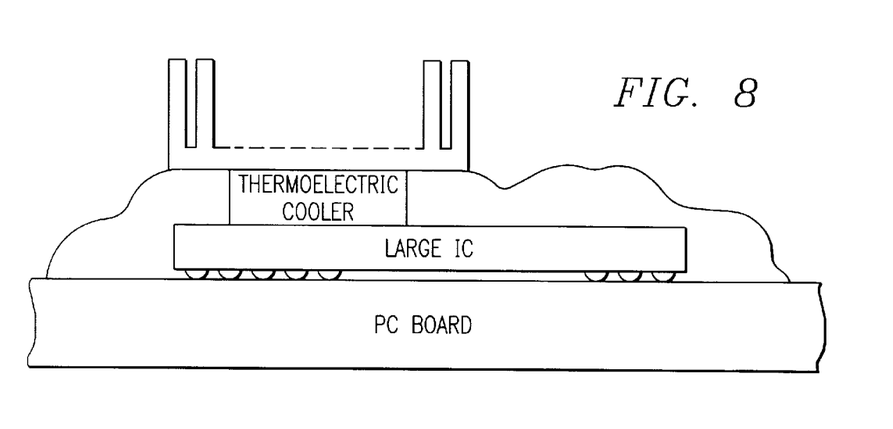
FIG. 8 schematically depicts the application of a small thermoelectric cooler to locally cool a selected part of an integrated circuit chip.

FIG. 8 schematically illustrates an application somewhat at the other end of the spectrum, where a micro size cooling apparatus is selectively bonded to parts of an integrated circuit chip for purposes of selective region cooling to control integrated circuit parameters. Such localized or spot cooling applications are particularly useful for voltage controlled oscillators, phase detectors, mixers, low noise amplifiers, lasers, photodiodes, and various material type optoelectric circuits.

The present invention has very broad applicability in part because it is not constrained to specific thermoelectric materials, cooling systems or electronic configurations. The invention utilizes the thermal dynamics of thermoelectric coolers to isolate heat transfer characteristics and attain higher cooling efficiency, through maximizing the transport of thermoelectric elements.

It will be understood by those skilled in the art that the embodiments set forth hereinbefore are merely exemplary of the numerous arrangements for which the invention may be practiced, and as such may be replaced by equivalents without departing from the invention which will now be defined by appended claims.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A thermoelectric cooling apparatus comprising:
a first thermoelectric element;
a second thermoelectric element; and
a junction positioned between and coupled to said first and second thermoelectric elements wherein said junction conducts electrical current between said first and second thermoelectric elements and has a preferential thermal conductivity in a direction different from the direction of electric current.

2. The apparatus, as recited in claim 1, further comprising a thermal sink coupled to said junction.

3. The apparatus, as recited in claim 2, wherein said thermoelectric cooling apparatus is enabled such that said thermal sink absorbs thermal energy.

4. The apparatus, as recited in claim 1, further comprising:
a first thermal sink coupled to said first thermoelectric element; and
a second thermal sink coupled to said second thermoelectric element.

5. The apparatus, as recited in claim 1, further comprising a third thermoelectric element coupled to said second thermoelectric element.

6. The apparatus, as recited in claim 5, further comprising a conductive element coupled to said second thermoelectric element and said third thermoelectric element.

7. The apparatus, as recited in claim 1, wherein said first and second thermoelectric elements are configured as a thermoelectric array.

8. The apparatus, as recited in claim 1, wherein said thermoelectric cooling apparatus includes multi-staged thermoelectric elements.

9. The apparatus, as recited in claim 1, wherein said first and second thermoelectric element include at least one Peltier device.

10. The apparatus, as recited in claim 1, wherein said thermoelectric cooling apparatus is configured as a lateral thermoelectric cooling apparatus.

11. The apparatus, as recited in claim 1, wherein said thermoelectric cooling apparatus is associated with a food refrigeration system.

12. The apparatus, as recited in claim 1, wherein said thermoelectric cooling apparatus is associated with a vehicle occupant cooling system.

13. The apparatus, as recited in claim 1, wherein said thermoelectric cooling apparatus is associated with at least one integrated circuit device.

14. The apparatus, as recited in claim 1, wherein the thermal conductivity is much greater in the direction different from the direction of the electrical current than in the direction of the electrical current.

15. The apparatus, as recited in claim 1, wherein a preferential direction of thermal conduction is substantially orthogonal to the direction of the electrical current.

16. A thermoelectric cooling apparatus comprising:
a first thermoelectric element;
a second thermoelectric element; and
a junction positioned between and coupled to said first and second thermoelectric elements; wherein
said thermoelectric apparatus is enabled to transport energy between said junction and said first and second thermoelectric elements.

17. A thermoelectric cooling apparatus comprising:
a first thermoelectric element;
a second thermoelectric element;
a third thermoelectric element coupled to said second thermoelectric element; and
a junction positioned between and coupled to said first and second thermoelectric elements wherein said junction conducts electrical current between said first and second thermoelectric elements and has a preferential thermal conductivity in a direction different from the direction of electric current.

18. The apparatus, as recited in claim 17, wherein said thermoelectric apparatus is enabled to transport energy between said junction and said first and second thermoelectric elements.

19. The apparatus, as recited in claim 17, further comprising a thermal sink coupled to said junction.

20. The apparatus, as recited in claim 19, wherein said thermoelectric cooling apparatus is enabled such that said thermal sink absorbs thermal energy.

21. The apparatus, as recited in claim 17, further comprising:
a first thermal sink coupled to said first and third thermoelectric elements; and
a second thermal sink coupled to said second thermoelectric element.

22. The apparatus, as recited in claim 17, further comprising a conductive element coupled to said second thermoelectric element and said third thermoelectric element.

23. The apparatus, as recited in claim 17, wherein said first and second thermoelectric elements are configured as a thermoelectric array.

24. The apparatus, as recited in claim 17, wherein said thermoelectric cooling apparatus includes multi-staged thermoelectric elements.

25. The apparatus, as recited in claim 17, wherein said first and second thermoelectric element include at least one Peltier device.

26. The apparatus, as recited in claim 17, wherein said thermoelectric cooling apparatus is configured as a lateral thermoelectric cooling apparatus.

27. The apparatus, as recited in claim 17, wherein said thermoelectric cooling apparatus is associated with a food refrigeration system.

28. The apparatus, as recited in claim 17, wherein said thermoelectric cooling apparatus is associated with a vehicle occupant cooling system.

29. The apparatus, as recited in claim 17, wherein said thermoelectric cooling apparatus is associated with at least one integrated circuit device.

30. The apparatus, as recited in claim 17, wherein the thermal conductivity is much greater in the direction different from the direction of the electrical current than in the direction of the electrical current.

31. The apparatus, as recited in claim 17, wherein a preferential direction of thermal conduction is substantially orthogonal to the direction of the electrical current.

32. A thermoelectric cooling apparatus comprising:
a first thermoelectric element;
a second thermoelectric element;
a third thermoelectric element coupled to said second thermoelectric element; and
a junction positioned between and coupled to said first and second thermoelectric elements; wherein
said junction includes at least one carbon nanotube.

33. A method of operating a thermoelectric cooling apparatus having a first thermoelectric element, a second thermoelectric element, and a junction positioned between and coupled to the first and second thermoelectric elements, wherein said junction conducts electrical current between said first and second thermoelectric elements and has a preferential thermal conductivity in a direction different from the direction of electric current, comprising the steps of:

enabling a voltage across the first thermoelectric element, the second thermoelectric element, and the junction; and transporting energy between the junction and the first and second thermoelectric elements in response to the voltage.

34. The method, as recited in claim 33, further comprising the steps of:

providing a thermal sink coupled to the junction; and absorbing thermal energy in the thermal sink.

35. The method, as recited in claim 33, further comprising the step of providing a third thermoelectric element coupled to the second thermoelectric element.

36. The method, as recited in claim 35, wherein the step of transporting further includes transporting energy between the second and third thermoelectric elements.

37. A method of operating a thermoelectric cooling apparatus having a first thermoelectric element, a second thermoelectric element, and a junction positioned between and coupled to the first and second thermoelectric elements, comprising the steps of:

enabling a voltage across the first thermoelectric element, the second thermoelectric element, and the junction;

transporting energy between the junction and the first and second thermoelectric elements in response to the voltage; and providing at least one carbon nanotube coupled to the junction.

38. A method of operating a thermoelectric cooling apparatus having a first thermoelectric element, a second thermoelectric element, a third thermoelectric element coupled to the second thermoelectric element, and a junction positioned between and coupled to the first and second thermoelectric elements, comprising the steps of:

enabling a voltage across the first thermoelectric element, the second thermoelectric element, the third thermoelectric element, and the junction; and transporting energy between the junction and the first thermoelectric element, the second thermoelectric element and the third thermoelectric element in response to the voltage.

39. The method, as recited in claim 38, further comprising the steps of:

providing a thermal sink coupled to the junction; and absorbing thermal energy in the thermal sink.

40. A method of operating a thermoelectric cooling apparatus having a first thermoelectric element, a second thermoelectric element, a third thermoelectric element coupled to the second thermoelectric element, and a junction positioned between and coupled to the first and second thermoelectric elements, comprising the steps of:

enabling a voltage across the first thermoelectric element, the second thermoelectric element, the third thermoelectric element, and the junction;

transporting energy between the junction and the first thermoelectric element, the second thermoelectric element and the third thermoelectric element in response to the voltage; and providing at least one carbon nanotube coupled to the junction.

* * * * *

UNITED STATES PATENT AND TRADEMARK OFFICE
CERTIFICATE OF CORRECTION

PATENT NO. : 6,282,907 B1
DATED : September 4, 2001
INVENTOR(S) : Ghoshal

It is certified that error appears in the above-identified patent and that said Letters Patent is hereby corrected as shown below:

<u>Column 12,</u>
Line 6, after "elements,", insert -- wherein said junction conducts electrical current between said first and second thermoelectric elements and has a preferential thermal conductivity in a direction different from the direction of electric current, --.

Signed and Sealed this

Tenth Day of September, 2002

*Attest:*

*Attesting Officer*

JAMES E. ROGAN
*Director of the United States Patent and Trademark Office*